(12) United States Patent
Tuan

(10) Patent No.: US 7,498,836 B1
(45) Date of Patent: Mar. 3, 2009

(54) PROGRAMMABLE LOW POWER MODES FOR EMBEDDED MEMORY BLOCKS

(75) Inventor: Tim Tuan, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 90 days.

(21) Appl. No.: 11/325,888

(22) Filed: Jan. 4, 2006

Related U.S. Application Data

(63) Continuation-in-part of application No. 10/783,589, filed on Feb. 20, 2004, which is a continuation-in-part of application No. 10/666,669, filed on Sep. 19, 2003, now Pat. No. 7,098,689.

(51) Int. Cl.
*H03K 19/173* (2006.01)
(52) U.S. Cl. .......................... 326/38; 326/41
(58) Field of Classification Search ............... 326/26, 326/27, 37–41
See application file for complete search history.

(56) References Cited

U.S. PATENT DOCUMENTS

| | | | |
|---|---|---|---|
| 4,962,341 A | 10/1990 | Schoeff | |
| 5,303,390 A | 4/1994 | Little | |
| 5,362,989 A | 11/1994 | Hennedy | |
| 5,519,663 A | 5/1996 | Harper et al. | |
| 5,568,062 A | 10/1996 | Kaplinsky | |
| 5,583,457 A | 12/1996 | Horiguchi et al. | |
| 5,612,892 A | 3/1997 | Almulla | |
| 5,615,162 A * | 3/1997 | Houston | 365/226 |
| 5,671,149 A | 9/1997 | Brown | |
| 5,682,107 A | 10/1997 | Tavana et al. | |
| 5,712,790 A | 1/1998 | Ditlow | |
| 5,801,548 A | 9/1998 | Lee et al. | |
| 5,811,962 A | 9/1998 | Ceccherelli et al. | |
| 5,825,662 A | 10/1998 | Trimberger | |
| 5,832,286 A | 11/1998 | Yoshida | |
| 5,914,873 A | 6/1999 | Blish, II | |
| 5,946,257 A | 8/1999 | Keeth | |
| 5,958,026 A | 9/1999 | Goetting et al. | |
| 6,038,386 A | 3/2000 | Jain | |
| 6,114,843 A | 9/2000 | Olah | |
| 6,148,390 A | 11/2000 | MacArthur | |
| 6,160,418 A | 12/2000 | Burnham | |
| 6,169,419 B1 | 1/2001 | De et al. | |

(Continued)

OTHER PUBLICATIONS

U.S. Appl. No. 10/606,619, filed Jun. 26, 2003, New et al.

(Continued)

*Primary Examiner*—Don P Le
(74) *Attorney, Agent, or Firm*—William L. Paradice, II; Justin Liu

(57) ABSTRACT

A PLD (700) includes a plurality of logic blocks (701), a plurality of high gating circuits (702) coupled between corresponding logic blocks (701) and a supply voltage (VDD), a plurality of low gating circuits (703) coupled between corresponding logic blocks (701) and ground potential, and a plurality of control circuits (704) to provide control signals (CTRL) to the gating circuits. Each gating circuit pair selectively reduces the operating voltage provided to a corresponding logic block by one or more diode voltage drops in response to the corresponding control signal, thereby allowing the operating voltage provided to each logic block to be dynamically adjusted during run time in response to the control signals.

19 Claims, 11 Drawing Sheets

U.S. PATENT DOCUMENTS

| | | |
|---|---|---|
| 6,172,518 B1 | 1/2001 | Jenkins, IV et al. |
| 6,208,171 B1 * | 3/2001 | Kumagai et al. ............ 326/121 |
| 6,384,626 B2 | 5/2002 | Tsai et al. |
| 6,466,049 B1 | 10/2002 | Diba et al. |
| 6,489,804 B1 | 12/2002 | Burr |
| 6,583,645 B1 | 6/2003 | Bennett et al. |
| 6,631,502 B2 | 10/2003 | Buffet et al. |
| 6,710,621 B2 | 3/2004 | Devlin et al. |
| 6,711,719 B2 | 3/2004 | Cohn et al. |
| 6,747,478 B2 | 6/2004 | Madurawe |
| 6,839,888 B2 | 1/2005 | Gupta |
| 6,885,563 B2 | 4/2005 | Panella et al. |
| 6,936,917 B2 | 8/2005 | Lopata et al. |
| 6,950,998 B1 | 9/2005 | Tuan |
| 6,960,934 B2 | 11/2005 | New |
| 6,968,467 B2 | 11/2005 | Inoue et al. |
| 7,003,620 B2 | 2/2006 | Avraham et al. |
| 7,078,932 B2 | 7/2006 | Swami |
| 7,080,341 B2 | 7/2006 | Eisenstadt et al. |
| 7,109,748 B1 | 9/2006 | Liu et al. |
| 7,112,997 B1 | 9/2006 | Liang et al. |
| 7,135,886 B2 * | 11/2006 | Schlacter ................ 326/38 |
| 7,170,315 B2 | 1/2007 | Bakker et al. |
| 7,313,708 B2 | 12/2007 | Oshins |
| 2003/0218478 A1 | 11/2003 | Sani et al. |
| 2004/0145955 A1 | 7/2004 | Mizuno et al. |
| 2005/0091547 A1 | 4/2005 | Hanrieder et al. |
| 2005/0201174 A1 | 9/2005 | Klein et al. |
| 2006/0053246 A1 | 3/2006 | Lee |
| 2006/0069851 A1 | 3/2006 | Chung et al. |
| 2006/0202713 A1 | 9/2006 | Shumarayev |
| 2007/0001720 A1 | 1/2007 | Li et al. |
| 2003/0030326 A1 | 2/2007 | Shenai et al. |
| 2007/0164785 A1 | 7/2007 | He |

OTHER PUBLICATIONS

U.S. Appl. No. 10/666,669, filed Sep. 19, 2003, Tuan et al.
U.S. Appl. No. 10/783,589, filed Feb. 20, 2004, Look et al.
U.S. Appl. No. 10/377,857, filed Feb. 28, 2003, Blodget et al.
U.S. Appl. No. 10/783,216, filed Feb. 20, 2004, Tuan et al.
Mutoh, Shin'ichiro et al., "1 -V Power Supply High-speed Digital Circuit Technology with Multithreshold-Voltage CMOS", IEEE Journal Of Solid-state Circuits, Aug. 1995, pp. 847-854, vol. 30, No. 8, available from IEEE, 3 Park Avenue, 17th Floor, New York, NY 10016-5997.
Inukai, T. et al., "Boosted Gate MOS (BGMOS): Device/Circuit Cooperation Scheme to Achieve Leakage-Free Giga-Scale Integration" IEEE 2000 Custom Integrated Circuits Conference, May 21-24, 2000, pp. 409-412, available from IEEE, 3 Park Avenue, 17th Floor, New York, NY 10016-5997.
Kuroda, Tadahiro et al., "A 0.9-V, 150-MHz, 10-mW 4 $mm_2$, 2-D Discrete Cosine Transform Core Processor With Variable Threshold-Voltage (VT) Scheme", Nov. 1996, pp. 1770-1779, vol. 32, No. 11, available from IEEE, 3 Park Avenue, 17th Floor, New York, NY 10016-5997.
Hamzaoglu, Fatih et al., "Circuit-Level Techniques to Control Gate Leakage for Sub-100nm CMOS", ISLPED, Aug. 12-14, 2002, pp. 60-63, available from IEEE, 3 Park Avenue, 17th Floor, New York, NY 10016-5997.
He, Lei, "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http://eda.ee.ucla.edu/.

FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.
Takahashi, M. et al., "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.
Park, Jae Y. , Allen, Mark G., "A Comparison of Micromachined Inductors with Different Magnetic Core Materials"; 1996 Electronic Components and Technology Conference; 1996 IEEE; May 28-31, 1996, pp. 375-381.
Burd, Thomas D., et al., "A Dynamic Voltage Scaled Microprocessor System"; 2000 IEEE; IEEE Journal of Solid-State Circuits, vol. 35, No. 11, Nov. 2000; pp. 1571-1580.
Stratakos, Anthony J., et al., "A Low-Voltage CMOS DC-DC Converter for a Portable Battery-Operated System"; 1994 IEEE; Jun. 20-25, 1994, pp. 619-626.
Stratakos, Anthony John, "High-Efficiency Low-Voltage DC-DC Conversion for Portable Applications," Chapter 3; "DC-DC Converter Fundamentals"; Ph. D., UC, Berkeley, CA 1998, pp. 42-78.
Allen/Holberg; Chapter 10; "Bandgap Voltage Reference"; Apr. 12, 2000; downloaded on Jan. 3, 2006 from www.ece.utexas.edu/~holberg/lecture.notes/bandgap.pdf; pp. 1-5.
Microchip Technology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28.
Xilinx, Inc.; "Virtex-II Pro Platform FPGA Handbook"; published Oct. 14, 2002; available from Xilinx, Inc., 2100 Logic Drive, San Jose, California 95124; pp. 19-71.
Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.-3L.
Intel Corporation, "Intel PXA27x Processor Family Power Requirements", Application Note, 2004, pp. 1-36, available from Intel Corporation (Santa Clara) Corporate Office, 2200 Mission College Blvd., Santa Clara, California 95052-8119.
Nowka, Kevin J., A 32-bit PowerPC System-on-a-Chip With Support For Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.
Texas Instruments (Benchmarq)—Datasheet BQ4011 (32×8 nonvolatile SRAM) Aug. 1993 pp. 1-11.
Texas Instruments—Datasheet BQ4011 (32×8 nonvolatile SRAM) May 1999 pp. 1-15.
U.S. Appl. No. 10/971,934, filed Oct. 22, 2004, Jenkins, Jesse H. IV, entitled "Low Power Zones For Programmable Logic Devices", Xilinx, Inc., San Jose, CA (33 pages).
U.S. Appl. No. 11/268,265, filed Nov. 4, 2005, Rahman, Arifur, et al. entitled "Implementation of Low Power Standby Modes For Integrated Circuits", Xilinx, Inc., San Jose, CA (31 pages).
U.S. Appl. No. 11/326,542, filed Jan. 4, 2006, Jacobson, Neil G., et al., entitled "M ethod and Mechanism for Controlling Power Consumption of an Integrated Circuit", Xilinx, Inc., San Jose, CA (41 pages).
U.S. Appl. No. 11/329,646 filed Jan. 11, 2006, Jenkins, Jesse H. IV, entitled "Programmable Detection of Power Failure in an Integrated Circuit", Xilinx, Inc., San Jose, CA (26 pages).
U.S. Appl. No. 11/502,939, filed Aug. 11, 2006, Tuan, Tim, et al., entitled "Disabled Unused/Inactive Resources in Programmable Logic Devices for Static Power Reduction", Xilinx, Inc., San Jose, CA (17 pages).
US 6,981,160, 12/2005, Thaker et al. (withdrawn)

* cited by examiner

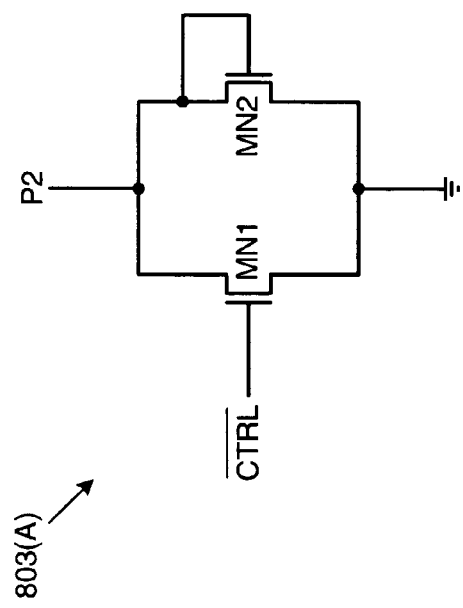
FIG. 8A
803(A)
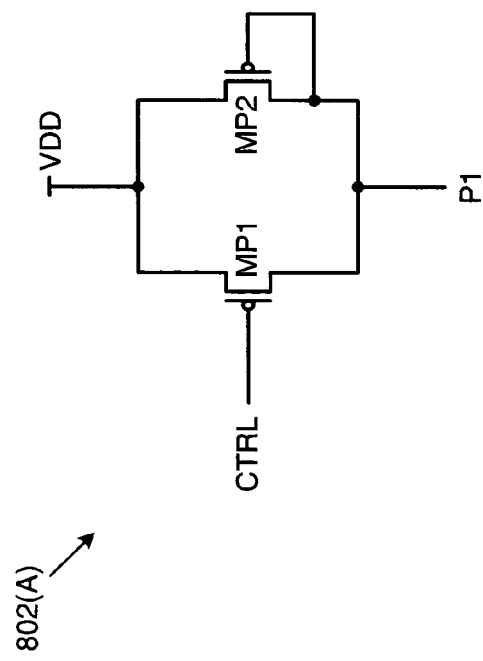
802(A)
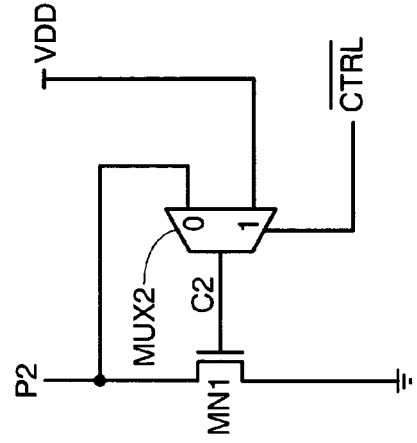
FIG. 8B
803(B)
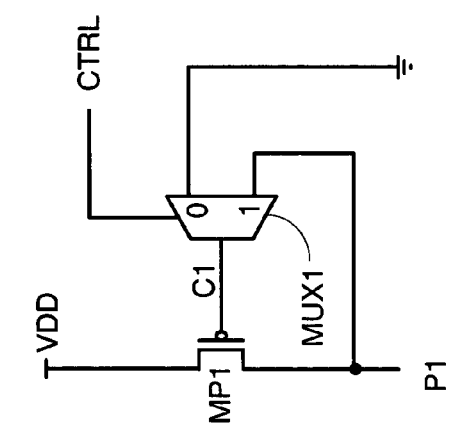
802(B)

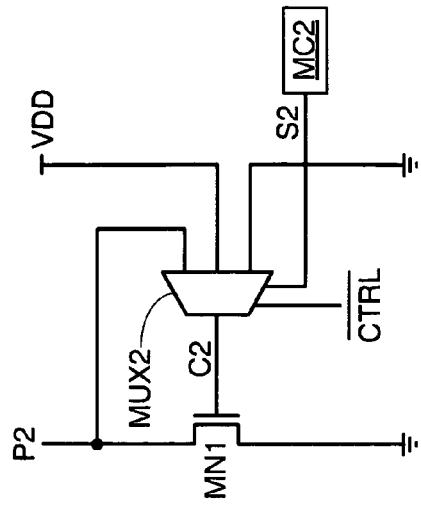
FIG. 8C
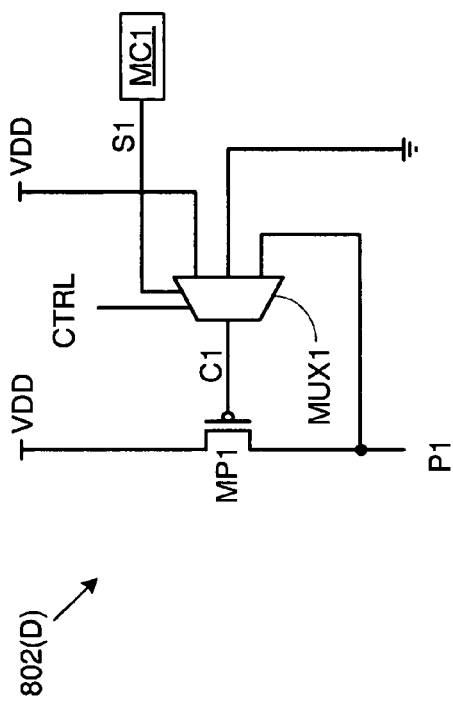
FIG. 8D
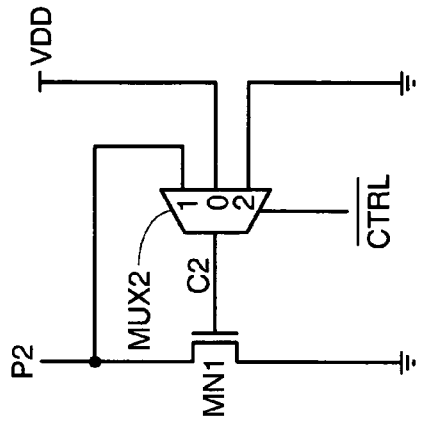
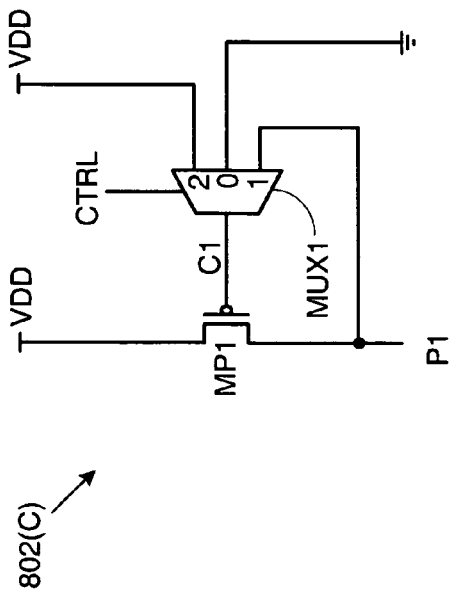

PROGRAMMABLE LOW POWER MODES FOR EMBEDDED MEMORY BLOCKS

RELATED APPLICATIONS

The present application is a continuation-in-part of U.S. patent application Ser. No. 10/783,589 entitled "Regulating Unused/inactive Resources in Programmable Logic Devices for Static Power Reduction" and filed on Feb. 20, 2004, which is a continuation-in-part of U.S. patent application Ser. No. 10/666,669 entitled "Disabling Unused/Inactive Resources in Programmable Logic Devices for Static Power Reduction" and filed on Sep. 19, 2003 now U.S. Pat. No. 7,098,689, both of which are incorporated by reference herein in their entireties.

FIELD OF THE INVENTION

The present invention relates to the regulation of the supply voltage provided to unused and/or inactive blocks in an integrated circuit (IC) device to achieve lower static power consumption. More specifically, the present invention relates to selectively reducing the operating voltage of various blocks of the IC device to reduce the leakage current and/or increase the performance of the device.

BACKGROUND

Improved performance in integrated circuits requires technology scaling. As technology is scaled, the physical dimensions of transistors, such as gate oxide thickness and transistor gate length, are reduced. The operating voltage of the transistor must scale to maintain an acceptable electric field across the gate oxide to maintain acceptable reliability. Lowering the operating voltage requires that the threshold voltage of the transistor be reduced. Transistor off-state leakage current consists of sub-threshold leakage, gate direct tunnel current, and band-to-band tunnel leakage current. The relationship of transistor off-state leakage currents with respect to device scaling is shown by Inukai, et al., in "Boosted Gate MOS (BGMOS): Device/Circuit Cooperation Scheme to Achieve Leakage-Free Giga-Scale Integration", IEEE Custom Integrated Circuit Conference, 19-2-1, 2000.

Inukai et al. teach that the sub-threshold leakage of the transistor becomes increasing large from one technology node to the next technology. At the same time, the gate leakage current of the transistor also increases as a result of reduction in gate oxide thickness. It has been reported that the gate leakage current increases by an order of magnitude for each 2 Angstrom reduction in gate oxide thickness. (Hamzaoglu et al., "Circuit-Level Techniques to Control Gate Leakage for sub-100 nm CMOS", ISLPED. p. 60-63, August 2002.) Inukai et al. project that the gate leakage current will exceed the sub-threshold leakage current and become the dominating factor in leakage at some technology node. Therefore, standby power becomes more and more problematic in technology scaling.

Circuit techniques to suppress leakage currents have been proposed in the literature. Kuroda et al. propose a VTMOS technique to suppress standby leakage current in "0.9V. 150-MHz, 10-mW, 4 mm², 2-D discrete cosine transform core processor with variable threshold-voltage (VT) scheme", IEEE Journal of Solid-State Circuits, vol. 31. pp. 1770-1779, 1996. In this VTMOS technique, the transistor is back-biased to raise the threshold voltage of the transistor in a standby mode. This technique can reduce the transistor sub-threshold leakage current, but does not reduce the gate tunneling leakage current.

Mutoh et al. propose an MTMOS technique in "I-V Power Supply High-Speed Digital Circuit Technology With Multi-Threshold Voltage CMOS", IEEE Journal of Solid-State Circuit, vol. 30, pp. 847-854, 1995. This MTMOS technique uses a transistor having a high threshold voltage (Vt) to supply a virtual VDD supply voltage and a ground supply voltage to core circuitry. The high Vt transistor has the same gate oxide thickness as transistors in the core circuitry, but is less leaky. However, the MTMOS technique faces a similar problem as the VTMOS technique. That is, the MTMOS technique does not reduce gate leakage current.

Inukai et al. propose a BGMOS technique. The BGMOS technique uses a thicker oxide transistor as a power switch to shut-off the leakage path in a standby mode. However, the disadvantage of this technique is that the stored data are lost in standby mode. Inukai et al. propose adding a memory cell to store the data in standby mode. However, this proposed solution results in a significant increase in area penalty.

It would therefore be desirable to have a technique that can reduce both the gate tunneling leakage and sub-threshold leakage while maintaining the circuit state without significantly increasing the area penalty for the upcoming technology node.

Note that programmable logic devices (PLDs), such as field programmable gate arrays (FPGAs), have a significantly higher static power consumption than dedicated logic devices, such as standard-cell application specific integrated circuits (ASICs). A reason for this high static power consumption is that for any given design, a PLD only uses a subset of the available resources. The unused resources are necessary for providing greater mapping flexibility to the PLD. However, these unused resources still consume static power in the form of leakage current. Consequently, PLDs are generally not used in applications where low static power is required.

It would therefore be desirable to reduce the static power consumption of integrated circuits such as PLDs.

SUMMARY

In accordance with one embodiment of the present invention, unused and/or inactive resources in a PLD are disabled to achieve lower static power consumption.

In accordance with embodiments of the present invention, an integrated circuit device may include a plurality of logic blocks, each logic block, which may be a memory array or other suitable resource, includes a first power terminal coupled to VDD by a first gating circuit. In some embodiments, the integrated circuit device includes a second power terminal coupled to ground potential by a second gating circuit. The gating circuits can be individually programmed to selectively provide a full operating voltage, a reduced operating voltage, or a negligible operating voltage to corresponding programmable logic blocks. For example, to place a selected programmable logic block in an active mode, its associated gating circuits can be programmed to directly couple the programmable logic block's first power terminal to VDD and to directly couple the programmable logic block's second power terminal to ground potential, thereby providing a full operating voltage to the selected programmable logic block. To place the selected programmable logic block in a suspend mode, its associated gating circuits can be programmed to provide a diode voltage drop between VDD and the programmable logic block's first power terminal and to provide a diode voltage drop between ground potential the programmable logic block's second power terminal, thereby providing a reduced operating voltage to the selected programmable logic block to reduce static power consumption of the selected programmable logic block without losing data stored therein. To place the selected programmable logic block in an inactive mode, its associated gating circuits can be programmed to isolate the programmable logic block's first power terminal from VDD and to isolate the programmable logic block's second power terminal from ground potential, thereby providing a negligible operating voltage to the selected programmable logic block to minimize static power consumption of the selected programmable logic block.

The present invention will be more fully understood in view of the following description and drawings.

BRIEF DESCRIPTION OF THE DRAWINGS

FIG. 8A illustrates circuit diagrams of first embodiments of the gating circuits of the PLDs of FIGS. 7A-7D;

FIG. 8B illustrates circuit diagrams of second embodiments of the gating circuits of the PLDs of FIGS. 7A-7D;

FIG. 8C illustrates circuit diagrams of third embodiments of the gating circuits of the PLDs of FIGS. 7A-7D; and FIG. 8D illustrates circuit diagrams of fourth embodiments of the gating circuits of the PLDs of FIGS. 7A-7D.

Like reference numerals refer to corresponding parts throughout the drawing figures.

DETAILED DESCRIPTION

In accordance with one embodiment of the present invention, inactive resources and unused resources in a programmable logic device (PLD), such as a field programmable gate array (FPGA), may be selectively disabled to reduce static power consumption by selectively adjusting the operating voltage provided to such resources. The present invention includes both an enabling software flow and an enabling hardware architecture, which are described in more detail below. Unused resources of the PLD can be disabled when designing a particular circuit to be implemented by the PLD (hereinafter referred to as "design time"). In addition, resources of the PLD that are temporarily inactive can be disabled during operation of the PLD (hereinafter referred to as "run time").

Figure 1:
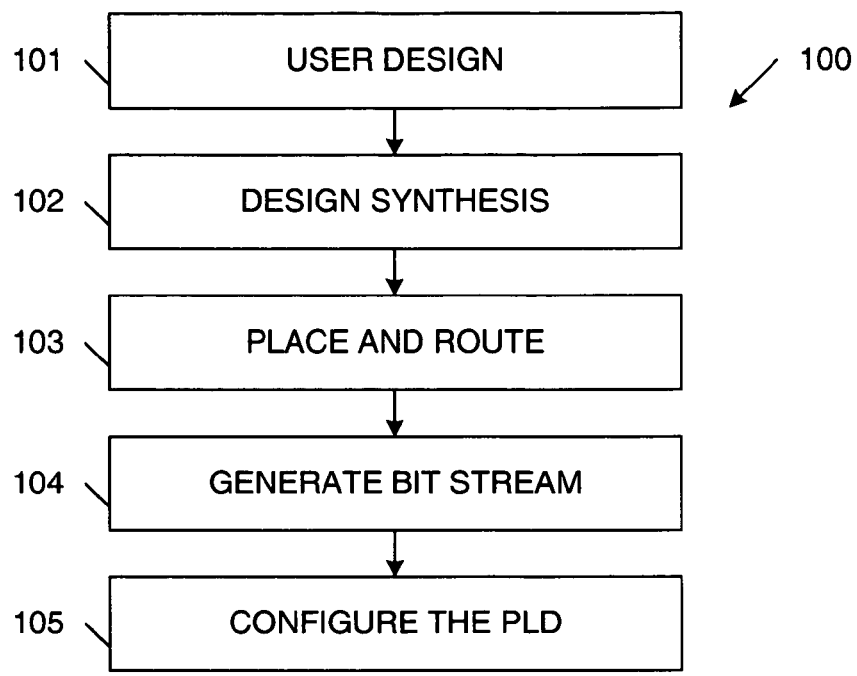
FIG. 1 is a flow diagram illustrating a conventional design flow used for PLDs.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bit stream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

In accordance with the present invention, unused resources of the PLD are identified during the design time, following the place and route process (Step 103). These unused resources are then selectively disabled during the design time. As described below, there are several ways to disable the unused resources. By selectively disabling the unused resources at design time, significant static power reduction may be achieved with no performance penalty.

Figure 2:
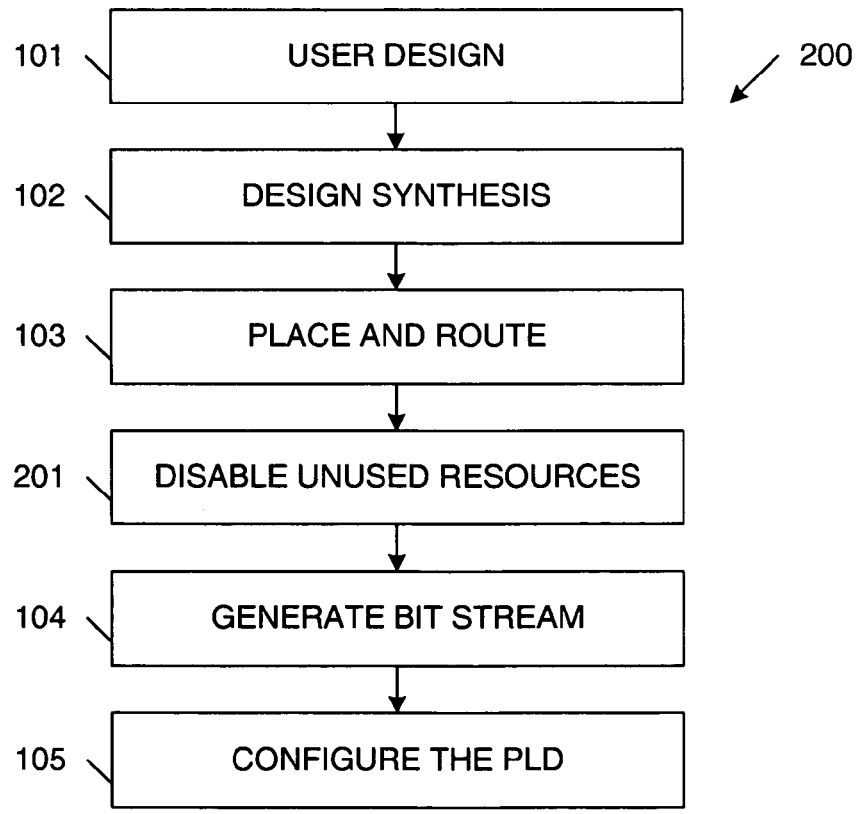
FIG. 2 is a flow diagram illustrating a design flow for a PLD in accordance with one embodiment of the present invention.

FIG. 2 is a flow diagram 200 illustrating a design flow in accordance with one embodiment of the present invention. Similar steps in flow diagrams 100 and 200 are labeled with similar reference numbers. Thus, flow diagram 200 includes Steps 101-105 of flow diagram 100, which are described above. In addition, flow diagram 200 includes the step of disabling unused resources in the PLD (Step 201). This step of disabling unused resources is performed after the place and route process has been completed in Step 103, and before the configuration bit stream is generated in Step 104. As described in more detail below, the unused resources are disabled by disabling predetermined programmable logic blocks of the PLD.

In another embodiment, further power savings are obtained by disabling temporarily inactive resources of the configured PLD during run time. Often, the entire design or parts of the design are temporarily inactive for some period of time. If the inactive period is sufficiently long, it is worthwhile to disable the inactive resources to reduce static power consumption. In a preferred embodiment, the decision of when to disable a temporarily inactive resource is made by the designer. In this embodiment, the user logic is provided access to a disabling mechanism, which enables the inactive resources to be disabled dynamically.

There are a number of techniques to disable resources in a PLD. In accordance with one embodiment, the PLD is logically subdivided into a plurality of separate programmable logic blocks. As described below, each programmable logic block may comprise one or more of the resources available on the programmable logic device. Switch elements are used to couple each of the programmable logic blocks to one or more associated voltage supply terminals (e.g., VDD or ground potential). The switch elements are controlled to perform a power-gating function, wherein unused and/or inactive programmable logic blocks are disabled (e.g., prevented from receiving power or receiving a reduced power). Preferably, only one of the voltage supply terminals (VDD or ground potential) is power-gated, thereby reducing the speed and area penalties associated with the switch elements. When the switch elements are controlled to de-couple the associated programmable logic blocks from the associated supply voltage, these programmable logic blocks are effectively disabled, thereby dramatically reducing the static power consumption of these blocks.

Figure 3:
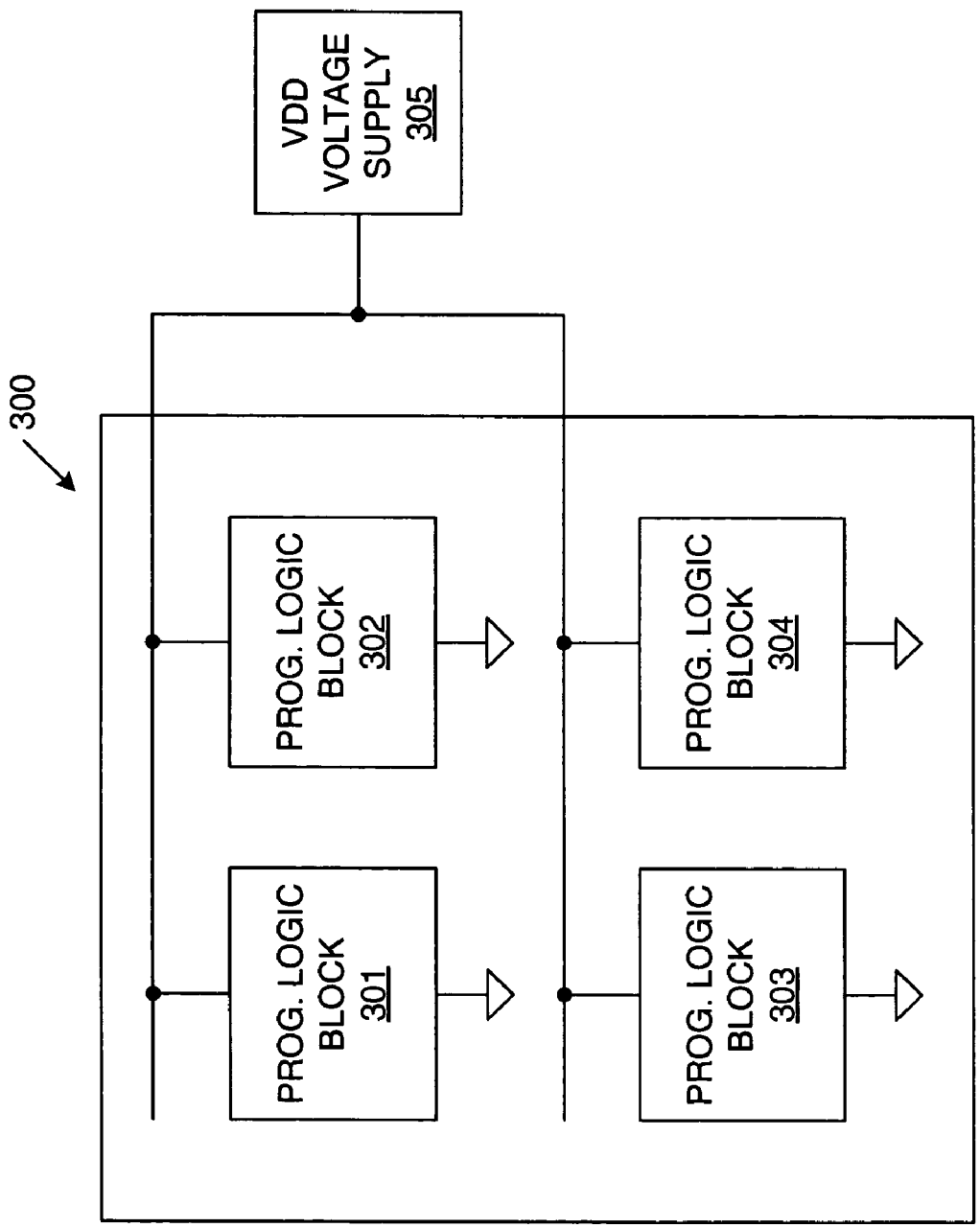
FIG. 3 is a block diagram of a conventional PLD having four blocks, which are all powered by the same off-chip VDD voltage supply.

FIG. 3 is a block diagram of a conventional PLD 300 having four programmable logic blocks 301-304, which are all powered by the same off-chip VDD voltage supply 305. Note that all four programmable logic blocks 301-304 are coupled to receive the VDD supply voltage during normal operating conditions, even if some of these blocks are not used in the circuit design.

Figure 4:
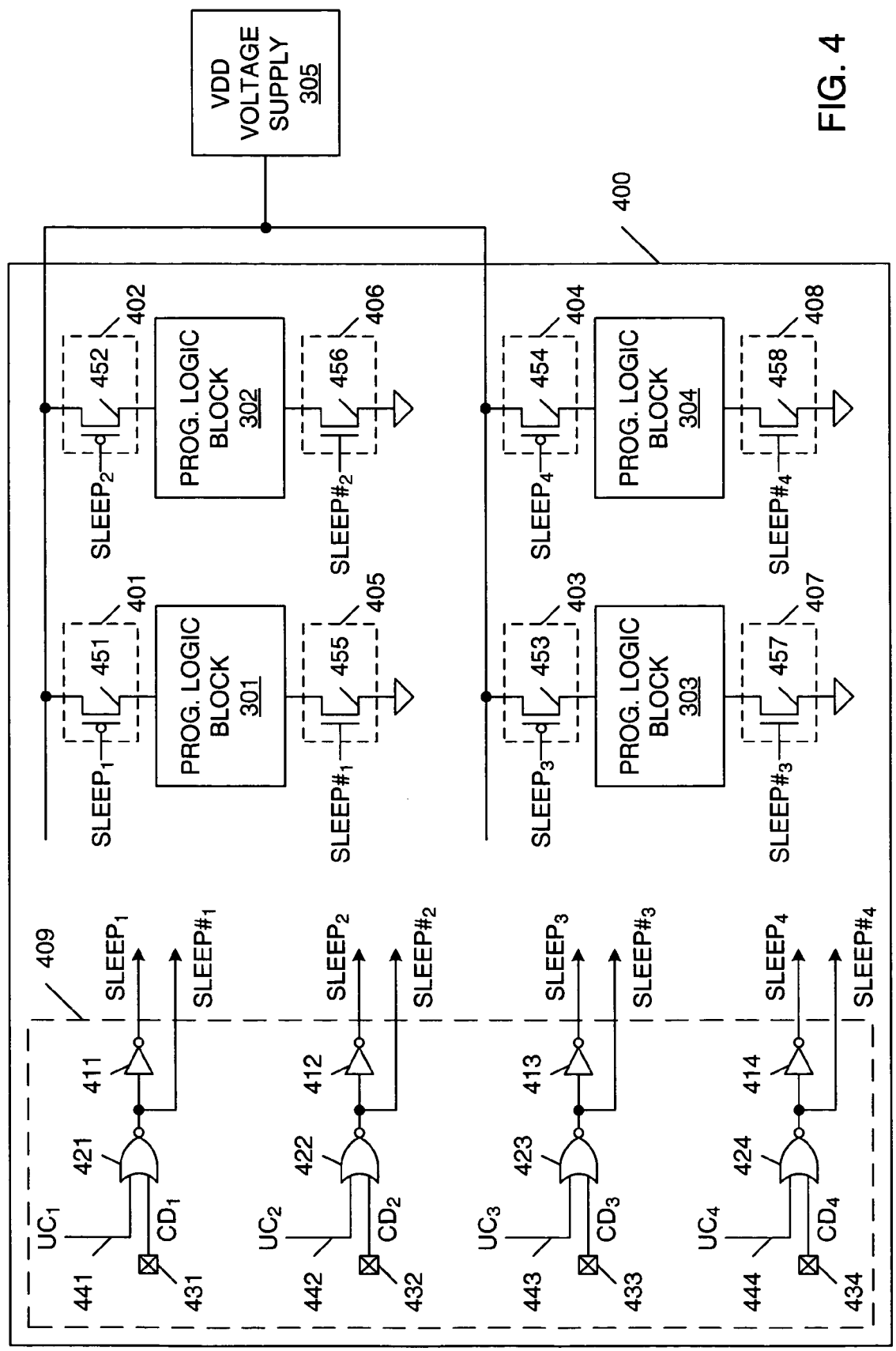
FIG. 4 is a block diagram of a PLD that implements power-gating switch elements in accordance with one embodiment of the present invention.

FIG. 4 is a block diagram of a PLD 400 in accordance with one embodiment of the present invention. Similar elements in FIGS. 3 and 4 are labeled with similar reference numbers. Thus, PLD 400 includes programmable logic blocks 301-304 and VDD voltage supply 305. In addition, PLD 400 includes switch elements 401-408, and control circuit 409. In the described embodiment, switch elements 401-404 are implemented by PMOS power-gating transistors 451-454, respectively, and switch elements 405-408 are implemented by NMOS power-gating transistors 455-458, respectively. In other embodiments, switch elements 401-408 may be any switch known to those ordinarily skilled in the art. Control circuit 409 is implemented by inverters 411-414, NOR gates 421-424, configuration memory cells 431-434, and user logic input terminals 441-444.

NOR gates 421-424 and inverters 411-414 are configured to generate power-gating control signals $SLEEP_1$-$SLEEP_4$ and $SLEEP\#_1$-$SLEEP\#_4$ in response to the configuration data values $CD_1$-$CD_4$ stored in configuration memory cells 431-434, respectively, and the user control signals $UC_1$-$UC_4$ provided on user logic input terminals 441-444, respectively.

For example, NOR gate 421 is coupled to receive configuration data value $CD_1$ from configuration memory cell 431 and user control signal $UC_1$ from user logic input terminal 441. If either the configuration data value $CD_1$ or the user control signal $UC_1$ is activated to a logic high state, then NOR gate 421 provides an output signal ($SLEEP\#_1$) having a logic "0" state. In response, inverter 411, which is coupled to the output terminal of NOR gate 421, provides an output signal ($SLEEP_1$) having a logic "1" state.

The $SLEEP_1$ signal is applied to the gate of PMOS power-gating transistor 451, which is coupled between block 301 and the VDD voltage supply terminal. The $SLEEP\#_1$ signal is applied to the gate of NMOS power-gating transistor 455, which is coupled between block 301 and the ground voltage supply terminal. The logic "0" state of the $SLEEP\#_1$ signal causes NMOS power-gating transistor 455 to turn off, thereby de-coupling block 301 from the ground supply voltage terminal. Similarly, the logic "1" state of the $SLEEP_1$ signal causes PMOS power-gating transistor 451 to turn off, thereby de-coupling block 301 from the VDD supply voltage terminal. De-coupling block 301 from the VDD and ground supply voltage terminals effectively disables block 301, thereby minimizing the static leakage current in this block.

If both the configuration data value $CD_1$ and the user control signal $UC_1$ are de-activated to a logic low state, then NOR gate 421 provides a $SLEEP\#_1$ signal having a logic "1" state, and inverter 411 provides a $SLEEP_1$ signal having a logic "0" state. The logic "1" state of the $SLEEP\#_1$ signal causes NMOS power-gating transistor 455 to turn on, thereby coupling block 301 to the ground voltage supply terminal. Similarly, the logic "0" state of the $SLEEP_1$ signal causes PMOS power-gating transistor 451 to turn on, thereby coupling block 301 to the VDD supply voltage terminal. Coupling block 301 to the VDD and ground supply voltage terminals effectively enables block 301.

Programmable logic block 302 may be enabled and disabled in response to configuration data value $CD_2$ and user control signal $UC_2$, in the same manner as block 301. Similarly, programmable logic block 303 may be enabled and disabled in response to configuration data value $CD_3$ and user control signal $UC_3$, in the same manner as block 301. Programmable logic block 304 may be enabled and disabled in response to configuration data value $CD_4$ and user control signal $UC_4$, in the same manner as block 301.

As described above, when a programmable logic block is used and active, the associated power-gating transistors are turned on. Conversely, when a programmable logic block is unused or inactive, the associated power gating transistors are turned off. The $SLEEP_1$-$SLEEP_4$ and $SLEEP\#_1$-$SLEEP\#_4$ signals can be controlled by the configuration data values $CD_1$-$CD_4$ stored by configuration memory cells 431-434, which are best suited for disabling the associated blocks at design time. If a block is not disabled at design time, this block can be disabled at run time by the user control signals $UC_1$-$UC_4$, which may be generated by the user logic, or by other means.

In accordance with another embodiment of the present invention, some blocks have multiple supply voltages. In this case all of the supply rails should be power-gated to achieve maximum power reduction. In accordance with another embodiment, only one switch element may be associated with each block. That is, the blocks are power-gated by de-coupling the block from only one power supply terminal, and not both the VDD and ground supply voltage terminals, thereby conserving layout area.

The granularity of the power-gated programmable logic blocks can range from arbitrarily small circuits to significant portions of the PLD. The decision concerning the size of each programmable logic block is made by determining the desired trade-off between power savings, layout area overhead of the switch elements and the control circuit, and speed penalty. In a FPGA, each programmable logic block may be selected to include one or more configuration logic blocks (CLBs), input/output blocks (IOBs), and/or other resources of the FPGA (such as block RAM, processors, multipliers, adders, transceivers).

Another way to disable a programmable logic block is by scaling down the local supply voltage to the block as low as possible, which dramatically reduces the power consumption, both static and dynamic, of the block. To scale down the local supply voltage in this manner, each independently controlled programmable logic block is powered by a separate switching regulator.

Figure 5:
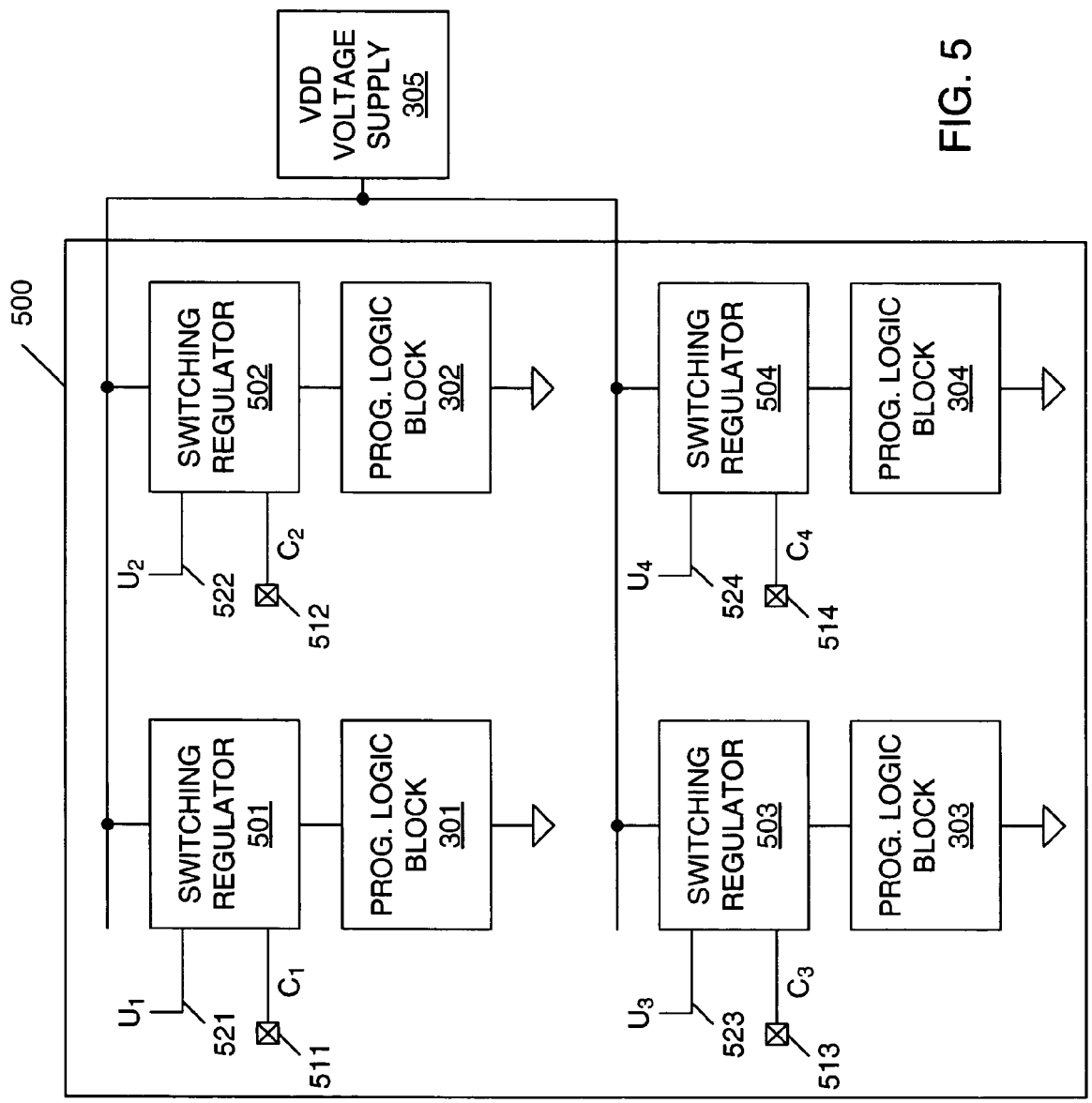
FIG. 5 is a block diagram of a PLD that implements switching regulators in accordance with some embodiments of the present invention.

FIG. 5 is a block diagram of a PLD 500 that implements switching regulators in accordance with one embodiment of the present invention. Similar elements in FIGS. 3 and 5 are labeled with similar reference numbers. Thus, PLD 500 includes programmable logic blocks 301-304 and VDD voltage supply 305. In addition, PLD 500 includes switching regulators 501-504, which are coupled between blocks 301-304, respectively, and VDD voltage supply 305. Switching regulators 501-504 are controlled by control circuits 511-514, respectively. In the described embodiment, switching regulators 501-504 reside on the same chip as blocks 301-304. However, in other embodiments, these switching regulators can be located external to the chip containing blocks 301-304. Switching regulators 501-504 can be programmably tuned to provide the desired supply voltages to the associated programmable logic blocks 301-304. For example, switching regulator 501 can provide a full VDD supply voltage to programmable logic block 301 when this block is used and active. However, switching regulator 501 can further be controlled to provide a reduced voltage (e.g., some percentage of the VDD supply voltage) to programmable logic block 301 when this block is unused or inactive. This reduced voltage may be predetermined (by design or via testing) depending on the desired circuit behavior. For example, this reduced voltage may be the minimum voltage required to maintain the state of the associated blocks. The power consumption of block 301 is significantly reduced when the supplied voltage is reduced in this manner.

Switching regulators 501-504 are controlled in response to the configuration data values $C_1$-$C_4$ stored in configuration memory cells 511-514, respectively, and the user control signals $U_1$-$U_4$ provided on user control terminals 521-524, respectively. A configuration data value (e.g., $C_1$) having an activated state will cause the associated switching regulator (e.g., switching regulator 501) to provide a reduced voltage to the associated programmable logic block (e.g., block 301). Similarly, a user control signal (e.g., $U_2$) having an activated state will cause the associated switching regulator (e.g., switching regulator 502) to provide a reduced voltage to the associated programmable logic block (e.g., block 502). A configuration data value (e.g., $C_3$) and an associated user control signal (e.g., $U_3$) both having have deactivated states will cause the associated switching regulator (e.g., switching regulator 503) to provide the full VDD supply voltage to the associated programmable logic block (e.g., block 503).

In accordance with one embodiment, configuration data values $C_1$-$C_4$ may be selected at design time, such that reduced voltages are subsequently applied to unused blocks during run time. User control signals $U_1$-$U_4$ may be selected during run time, such that reduced voltages are dynamically applied to inactive blocks at run time. Techniques for distributing multiple programmable down-converted voltages using on-chip switching voltage regulators are described in more detail in U.S. patent application Ser. No. 10/606,619, "Integrated Circuit with High-Voltage, Low-Current Power Supply Distribution and Methods of Using the Same" by Bernard J. New et al., which is hereby incorporated by reference in its entirety.

In the embodiment of FIG. 5, the granularity of the voltage scaled programmable logic blocks 301-304 should be fairly large because the overhead associated with switching regulators 501-504 is significant. In an FPGA, each programmable logic block 301-304 would most likely be divided into several clusters of configuration logic blocks (CLBs). The exact size of each programmable logic block is determined by the desired trade-off among power savings, layout area overhead of the switching regulators, and the speed penalty.

Figure 6:
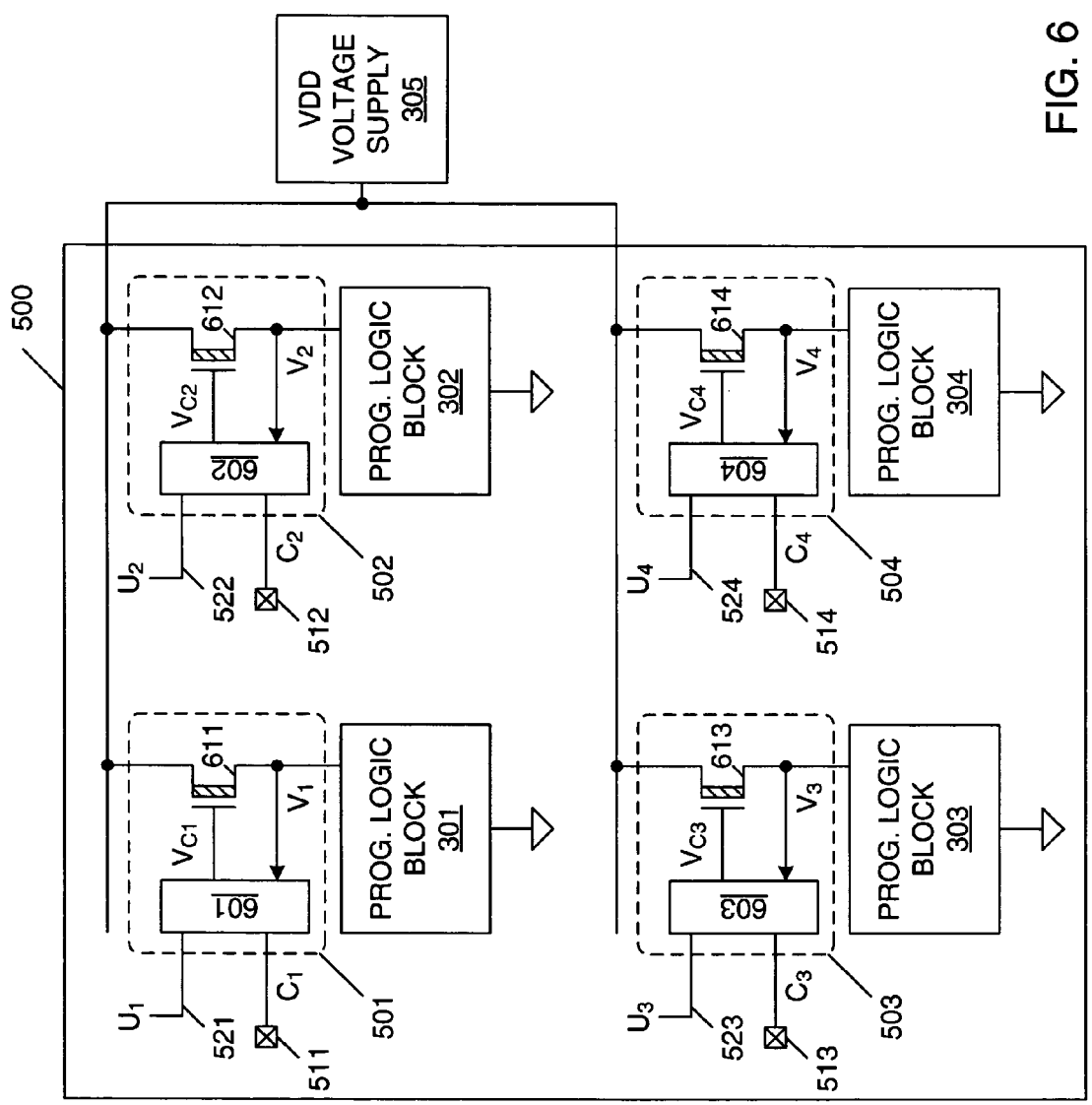
FIG. 6 is a block diagram of the PLD of FIG. 5, which shows switching regulators in accordance with one embodiment of the present invention.

FIG. 6 is a block diagram of PLD 500, which shows switching regulators 501-504 in accordance with one embodiment of the present invention. Switching regulators 501-504 include control blocks 601-604, respectively, and high-voltage n-channel transistors 611-614, respectively. High-voltage n-channel transistors 611-614 can tolerate high voltages and may have relatively thick gate dielectric layers (e.g., 50 to 60 Angstroms) and relatively wide channel regions. In some embodiments, the gate dielectric thickness of the high-voltage n-channel transistors 611-614 is approximately 4 to 6 times thicker than the gate dielectric thickness used in the programmable logic blocks 301-304. The drain of each of n-channel transistors 611-614 is coupled to the VDD voltage supply 305. The gates of n-channel transistors 611-614 are coupled to receive the control voltages $V_{C1}$-$V_{C4}$, respectively, from the corresponding control blocks 601-604. The sources of n-channel transistors 611-614 are configured to provide an operating voltage $V_1$-$V_4$, respectively, to programmable logic blocks 301-304, respectively. The source of each n-channel transistor 611-614 is also coupled to the corresponding control block 601-604 in a feedback configuration.

Each of n-channel transistors 611-614 forms a power switch between the VDD supply voltage 305 and the associated programmable logic block. Thick oxide n-channel transistors 611-614 are used to implement the power switches to ensure that a high voltage, herein referred to as $V_{BOOST}$, can be applied to the gates of n-channel transistors 611-614 when the associated programmable logic block is active. The high voltage $V_{BOOST}$ increases the drive current of n-channel transistors 611-614. In accordance with one embodiment, the high voltage $V_{BOOST}$ is about 2 to 2.5 times greater than VDD. When the high voltage $V_{BOOST}$ is applied to the gate of one of transistors 611-614, the corresponding operating voltage $V_1$-$V_4$ is pulled up to the full VDD supply voltage.

When a programmable logic block (e.g., programmable logic block 301) is inactive, the associated operating voltage (e.g., $V_1$) is reduced. The operating voltage applied to the associated programmable logic block is preferably selected to be high enough to retain data stored in this programmable logic block. In one embodiment, the operating voltage is reduced to a voltage that is about one half the VDD supply voltage. The operating voltage is reduced by applying a low voltage $V_{STANDBY}$ to the gate of the corresponding n-channel transistor (e.g., transistor 611). In one embodiment, the low voltage $V_{STANDBY}$ is about 80 to 100 percent of the VDD supply voltage.

In accordance with one embodiment, each of control blocks 601-604 is independently controlled to provide either the high voltage $V_{BOOST}$ or the low voltage $V_{STANDBY}$ to the associated n-channel transistor 611-614.

For example, control block 601 is configured to receive the user control signal $U_1$ and the configuration data value $C_1$, which have been described above. If both the user control signal $U_1$ and the configuration data value $C_1$ are deactivated, then control block 601 provides a control voltage $V_{C1}$ equal to the high voltage $V_{BOOST}$ to the gate of n-channel transistor 611. As a result, an operating voltage $V_1$ equal to the VDD supply voltage is applied to programmable logic block 301.

However, if either user control signal $U_1$ or configuration data value $C_1$ is activated, then control block 601 provides a control voltage $V_{C1}$ equal to the low voltage $V_{STANDBY}$ to the gate of n-channel transistor 611. As a result, an operating voltage $V_1$ approximately equal to one half the VDD supply voltage is applied to programmable logic block 301.

To ensure that the operating voltage $V_1$ applied to programmable logic block 301 has a value of ½ VDD when the $V_{STANDBY}$ voltage is applied to the gate of transistor 611, the control block 601 may include a feedback mechanism that adjusts the low voltage $V_{STANDBY}$ signal until the operating voltage $V_1$ is precisely equal to ½ VDD, or any other desired voltage.

It is well known that the gate current through a transistor typically increases by an order of magnitude for every 0.3 Volt increase in the VDD supply voltage. It is therefore expected that reducing the operating voltage of a programmable logic block by half (½ VDD) will reduce the gate current through the transistors present in the programmable logic block by an order of magnitude or more. At the same time, the sub-threshold leakage of these transistors will also decrease with the reduced operating voltage. Based on earlier generation technology, the leakage current may be reduced by 70% or more when reducing the operating voltage to ½ VDD. Simulation of a ring oscillator shows that the ring oscillator will operate properly at the lower operating voltage (½ VDD). It can be expected the associated logic block will retain stored data using the lower operating voltage. Therefore, the proposed switching regulators are capable of achieving more than 70% reduction in leakage current without a significant increase in area penalty and without sacrificing desired functionality.

The above-described embodiments may reduce the static power consumption of a PLD's programmable logic blocks by disabling unused logic blocks and/or reducing the operating voltage provided to inactive logic blocks. As known in the art, embedded memory elements such as Block RAM and the configuration memory cells of a PLD may account for a significant portion of the PLD's static power consumption. Indeed, leakage currents associated with volatile memory elements such as DRAM cells and/or SRAM cells consume static power even when not actively used by the PLD. Accordingly, several embodiments are described below that reduce the static power consumption of embedded memory elements by adjusting the operating voltage provided thereto, depending upon whether the memory elements are actively used by the PLD, without losing data stored in the inactive memory elements. Further, although described below with respect to memory elements provided within a PLD, embodiments of the present invention are equally applicable to memory elements provided in other types of IC devices (e.g., non-configurable IC devices such as ASIC devices), as well as to other programmable resources of a PLD (e.g., CLBs, IOBs, and the like).

Figure 7A:
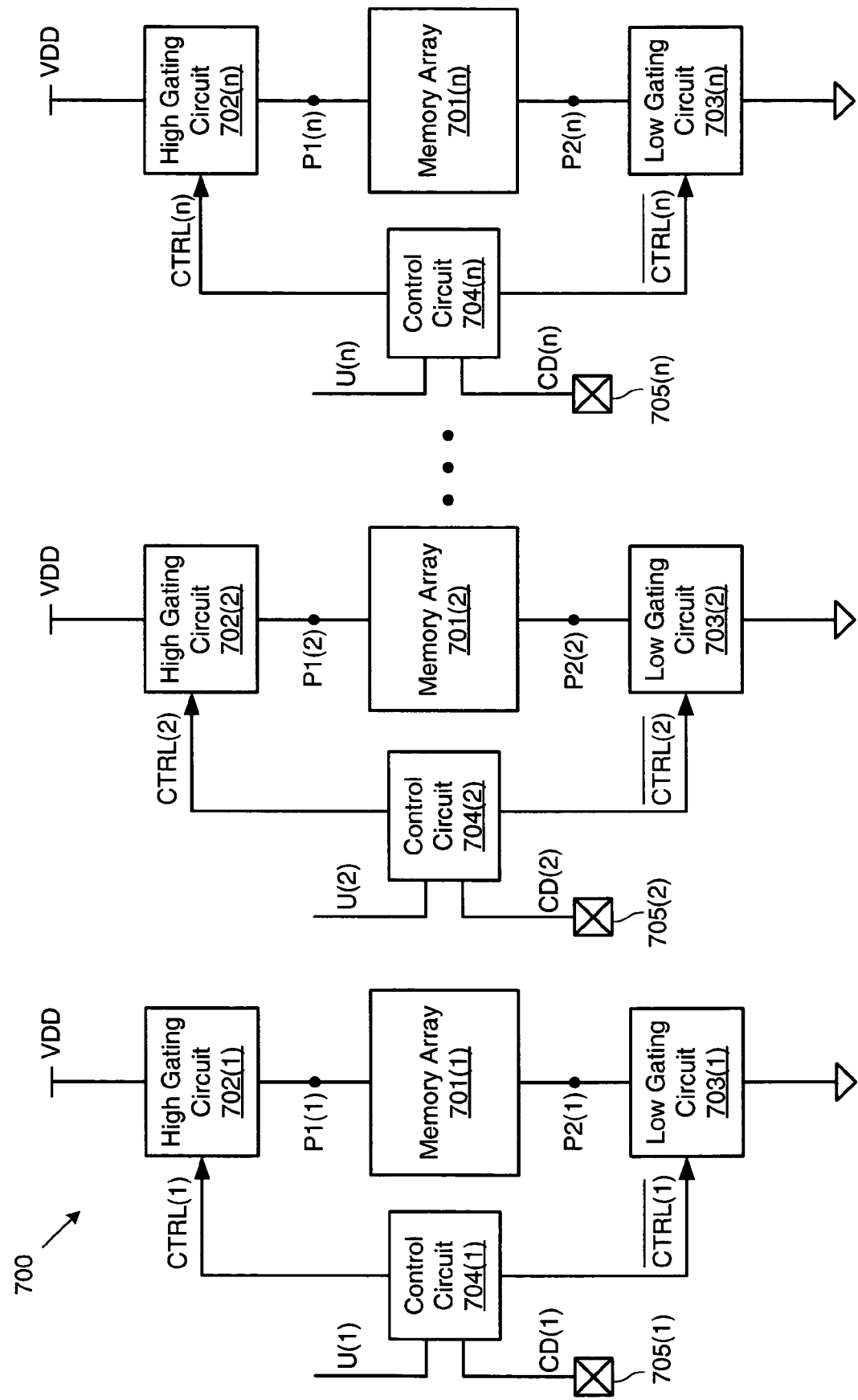
FIG. 7A is a block diagram of a PLD including gating circuits that selectively adjust the operating voltage provided to individual programmable logic blocks in accordance with one embodiment of the present invention.

FIG. 7A is a block diagram of a PLD 700 in accordance with one embodiment of the present invention. PLD 700 includes a plurality of memory arrays 701(1)-701(n), a power rail to provide the supply voltage VDD, a plurality of high gating circuits 702(1)-702(n), a plurality of low gating circuits 703(1)-703(n), and a plurality of control circuits 704(1)-704(n). Each memory array 701 includes a first power terminal coupled to a corresponding first power node P1, and includes a second power terminal coupled to a corresponding second power node P2. Memory arrays 701 may be any suitable type of memory array. For some embodiments, memory arrays 701 may include well-known volatile memory elements (e.g., SRAM or DRAM cells) suitable for implementing configuration memory cells, embedded block memory, and other storage elements of a PLD. In some embodiments, memory arrays 701 may include nonvolatile memory elements in place or in addition to volatile memory elements.

Each high gating circuit 702 is coupled between VDD and a corresponding power node P1, and includes a control terminal to receive a corresponding control signal CTRL from an associated control circuit 704. Each low gating circuit 703 is coupled between ground potential and a corresponding power node P2, and includes a control terminal to receive a corresponding control signal $\overline{CTRL}$, where $\overline{CTRL}$ is the logical complement of CTRL. For example, control circuit 704(1) provides CTRL(1) to high gating circuit 702(1), which is coupled between VDD and the power node P1(1) connected to the first power terminal of memory array 701(1), and provides $\overline{CTRL(1)}$ to low gating circuit 703(1), which is coupled between ground potential and the power node P2(1) connected to the second power terminal of memory array 701(1). For other embodiments, separate control circuits may be used to generate the CTRL/$\overline{CTRL}$ signal pairs.

For some embodiments, gating circuits 702-703 and control circuits 704 may reside on the same chip as memory arrays 701, as depicted in the exemplary embodiment of FIG. 7A. For other embodiments, some or all of gating circuits 702-703 and control circuits 704 may be located external to the chip containing memory arrays 701.

Each of gating circuits 702-703 may be independently controlled to selectively adjust the operating voltage provided to individual memory arrays 701 in response to corresponding control signal pairs CTRL and $\overline{CTRL}$, as described below. Each control circuit 704 may generate the control signals CTRL and $\overline{CTRL}$ in any suitable manner. For some embodiments, control circuits 704 may generate the control signals in response to configuration data (CD) generated at design time and stored in associated memory elements 705 during configuration of the PLD, for example, so that memory arrays 701 not used by a particular user design may be disabled upon device power-on to reduce static power consumption. For other embodiments, control circuits 704 may generate the control signals in response to user signals U generated external or internal to the PLD and provided to the control circuits 704 via suitable I/O pins (not shown for simplicity) of the PLD during run time. For yet other embodiments, control circuits 704 may be configured to generate the control signals in response to operating conditions observed during run time. For example, in one such embodiment, one or more of control circuits 704 may include or be coupled to well-known power management circuitry (not shown for simplicity) that monitors device activity and generates the control signals CTRL in response to the monitored device activity. For one embodiment, the power management circuitry may be configured to monitor activity on the PLD's I/O pins to determine which (if any) of the memory arrays 701 are inactive for a selected time period. For another embodiment, the power management circuitry may be configured to monitor activity of various internal nodes and/or signal lines to determine which (if any) of the memory arrays 701 are inactive for a selected time period. In either embodiment, the power management circuitry may generate values of the control signals CTRL that cause a first set of gating circuit pairs 702-703 to provide a reduced operating voltage to corresponding memory arrays 701 that are inactive for the selected time period and that cause a second set of gating circuit pairs 702-703 to provide a full operating voltage to corresponding memory arrays 701 that remain active.

An exemplary operation of PLD 700 is as follows. To place one or more selected memory arrays 701 in an active mode during which the selected memory arrays 701 are enabled for normal operation, the corresponding control signals are driven to a first state to cause associated gating circuits 702-703 to provide VDD as the operating voltage to the selected memory arrays 701. For example, to place memory array 701(1) in the active mode, CTRL(1) is driven to a first state that causes high gating circuit 702(1) to couple power node P1(1) directly to VDD, and its complement $\overline{CTRL(1)}$ causes low gating circuit 703(1) to couple power node P2(1) directly to ground potential. In this manner, gating circuits 702(1) and 703(1) together provide a full operating voltage (e.g., approximately equal to VDD) to memory array 701(1), thereby effectively enabling memory array 701(1) for normal operation. Any number of the other memory arrays 701(2)-701(n) may be independently placed in the active mode in a similar manner, for example, by driving corresponding control signals CTRL(2)-CTRL(n) to the first state.

To place one or more selected memory arrays 701 in a suspend mode during which the selected memory arrays 701 are not fully operational but yet retain data stored therein, the corresponding control signals are driven to a second state to cause associated gating circuits 702-703 to provide a reduced operating voltage to the selected memory arrays 701, thereby reducing the static power consumption of the selected memory arrays 701. For example, to place memory array 701(1) in the suspend mode, CTRL(1) is driven to the second state to cause high gating circuit 702(1) to generate a voltage drop, such as a diode voltage drop, between VDD and power node P1(1), and its complement $\overline{CTRL(1)}$ causes low gating circuit 703(1) to generate a voltage drop, such as a diode voltage drop, between ground potential and power node P2(1), thereby providing a reduced operating voltage (e.g., a fraction of VDD or a voltage less than VDD) to memory array 701(1). The reduced operating voltage provided to the selected memory array(s) may be predetermined (by design or by testing) according to desired circuit behavior. For example, the reduced operating voltage may be the minimum voltage necessary to retain data stored in the memory array(s) 701. Any number of the other memory arrays 701(2)-701(n) may be independently placed in the suspend mode in a similar manner, for example, by driving corresponding control signals CTRL(2)-CTRL(n) to the second state. As mentioned above, it is well known that the gate current through a transistor decreases as the operating voltage decreases. Therefore, reducing the operating voltage of selected memory arrays 701 may significantly reduce static power consumption in the selected memory arrays 701.

To place one or more selected memory arrays 701 in an inactive mode during which the selected memory arrays 701 are disabled (e.g., and thus do not retain data stored therein), the corresponding control signals may be driven to a third state to cause associated gating circuits 702-703 to provide a negligible operating voltage to the selected memory arrays 701, thereby minimizing static power consumption of the selected memory arrays 701. For example, to place memory array 701(1) in the inactive mode, CTRL(1) is driven to the third state to cause high gating circuit 702(1) to de-couple power node P1(1) from VDD, and the associated control signal $\overline{CTRL(1)}$ causes low gating circuit 703(1) to de-couple power node P2(1) from ground potential, thereby providing a negligible operating voltage to memory array 701(1) to effectively disable memory array 701(1) and thus minimize its static power consumption (although data stored therein may be lost). Any number of the other memory arrays 701(2)-701 (n) may be independently placed in the inactive mode in a similar manner, for example, by driving corresponding control signals CTRL(2)-CTRL(n) to the third state.

Figure 7B:
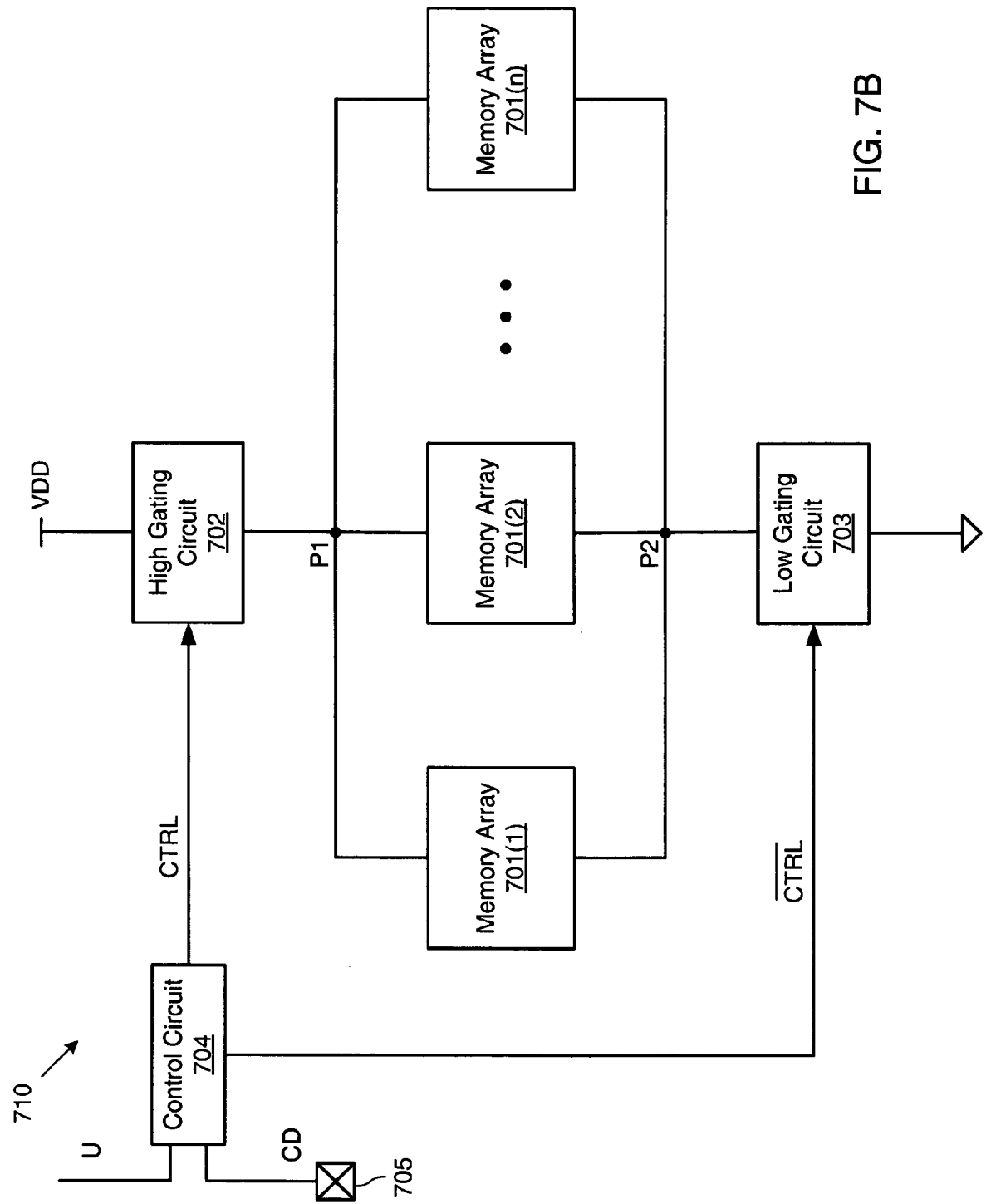
FIG. 7B is a block diagram of a PLD including gating circuits that selectively adjust the operating voltage provided to the programmable logic blocks in accordance with another embodiment of the present invention.

As described above, the operating voltage provided to each of memory arrays 701(11)-701(n) may be independently adjusted by corresponding gating circuit pairs 702(1)-702(n) and 703(1)-703(n) in response to control signals CTRL(1)-CTRL(n) and $\overline{CTRL(1)}$-$\overline{CTRL(n)}$, respectively. However, for other applications, conserving the silicon area occupied by the PLD may be a more important consideration than the ability to independently control the operating voltage provided to each of memory arrays 701(11)-701(n). For example, FIG. 7B shows a PLD 710 in accordance with another embodiment of the present invention. For PLD 710, the first power terminals of memory arrays 701(1)-701(n) are coupled to the same first power node P1, and the second power terminals of memory arrays 701(1)-701(n) are coupled to the same second power node P2. A single high gating circuit 702 coupled between power node P1 and VDD includes a control terminal to receive CTRL from control circuit 704, and a single low gating circuit 703 coupled between power node P2 and ground potential includes a control terminal to receive $\overline{CTRL}$ from control circuit 704. In operation, gating circuits 702-703 of PLD 710 adjust the operating voltage provided to memory arrays 701(1)-701(n) of PLD 710 in response to CTRL and $\overline{CTRL}$ in a manner similar to that described above with respect to FIG. 7A, except that all memory arrays 701(1)-701(n) receive the same operating voltage. In general, a tradeoff may be made between silicon area and granularity of the power gating by adjusting the number of gating circuits.

Figure 7C:
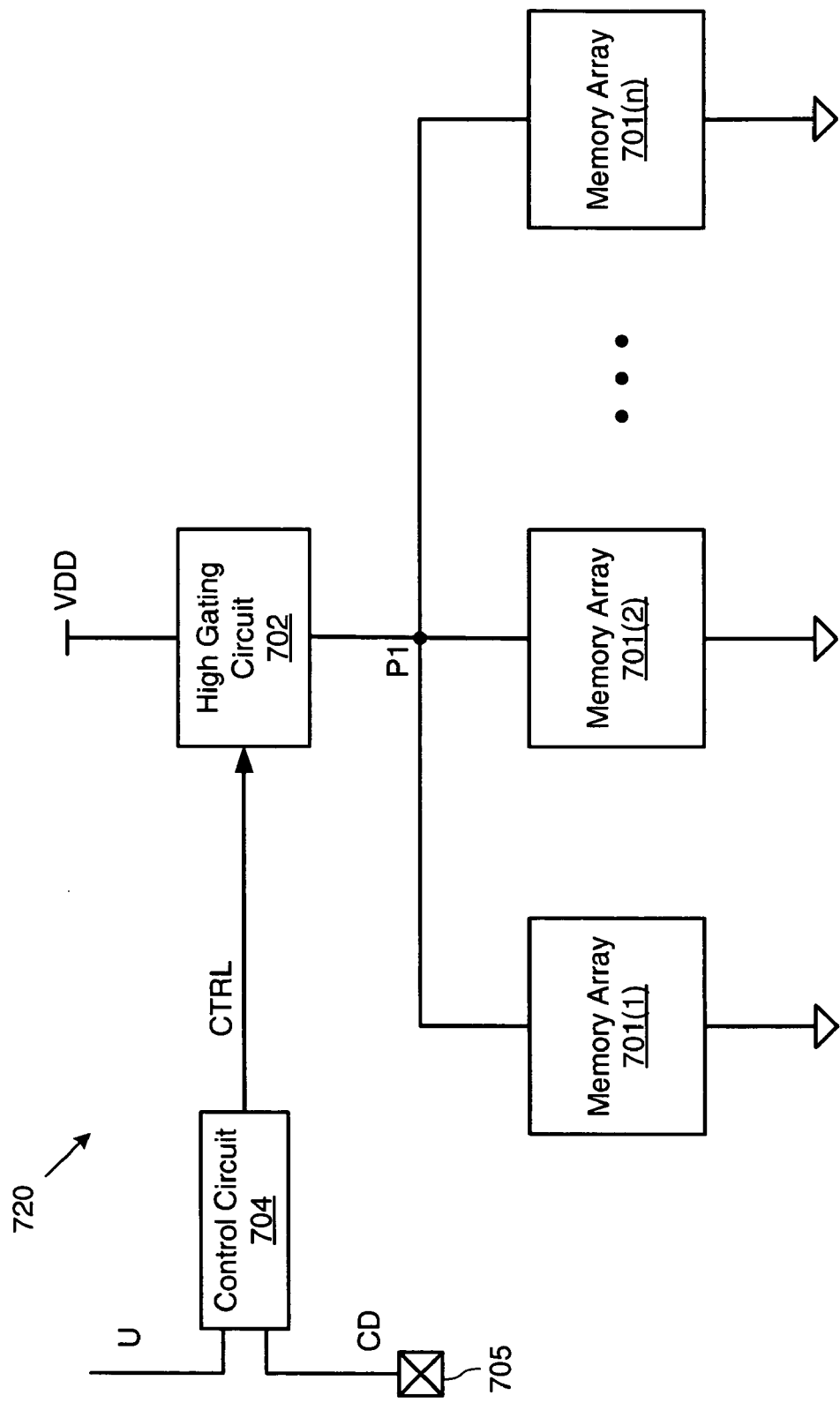
FIG. 7C is a block diagram of a PLD including a gating circuit that selectively adjusts the operating voltage provided to the programmable logic blocks in accordance with yet another embodiment of the present invention.
Figure 7D:
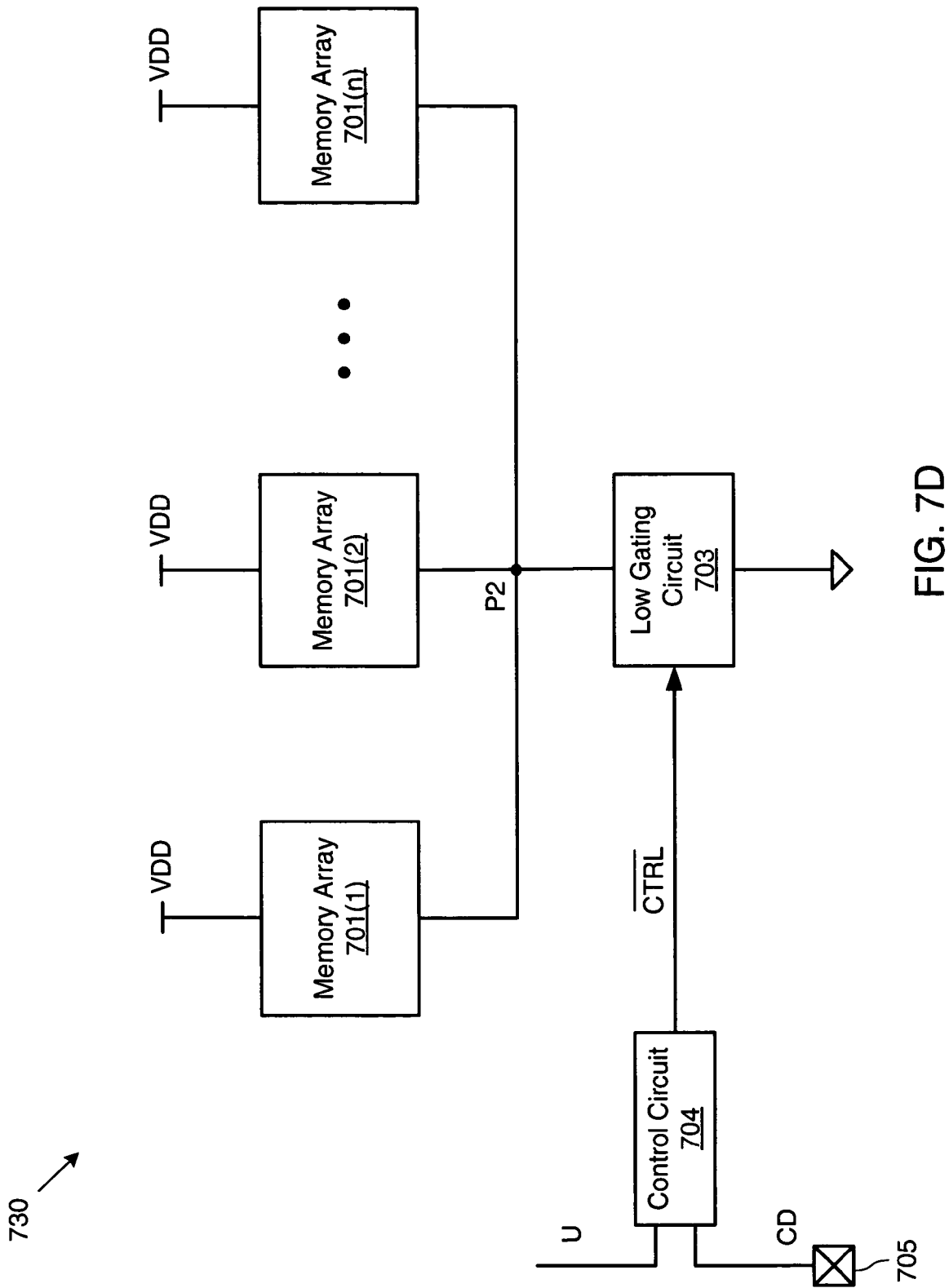
FIG. 7D is a block diagram of a PLD including a gating circuit that selectively adjusts the operating voltage provided to the programmable logic blocks in accordance with yet another embodiment of the present invention.

For other embodiments, additional silicon area may be conserved by providing a gating circuit for only one of the power terminals of memory arrays 701. For one example, FIG. 7C shows a PLD 720 in accordance with yet another embodiment of the present invention. For PLD 720, the first power terminals of memory arrays 701(11)-701(n) are coupled to VDD via high gating circuit 702, and the second power terminals of memory arrays 701(11)-701(n) are coupled directly to ground potential. The elimination of low gating circuit 703 reduces the circuit area of PLD 720, for example, as compared to PLD 710 of FIG. 7B. For another example, FIG. 7D shows a PLD 730 in accordance with yet another embodiment of the present invention. For PLD 730, the first power terminals of memory arrays 701(1)-701(n) are coupled directly to VDD, and the second power terminals of memory arrays 701(1)-701(n) are coupled to ground potential via low gating circuit 703. The elimination of high gating circuit 702 reduces the circuit area of PLD 730, for example, as compared to PLD 710 of FIG. 7B.

FIG. 8A shows a high gating circuit 802(A) and a low gating circuit 803(A) in accordance with one embodiment of the present invention. High gating circuit 802(A) includes PMOS transistors MP1-MP2. Transistor MP1 is coupled between VDD and power node P1, and includes a gate to receive CTRL. Transistor MP2 is a diode-connected transistor coupled between VDD and power node P1. Low gating circuit 803(A) includes NMOS transistors MN1-MN2. Transistor MN1 is coupled between ground potential and power node P2, and includes a gate to receive $\overline{CTRL}$. Transistor MN2 is a diode-connected transistor coupled between ground potential and power node P2.

To place a corresponding memory array 701 in the active mode using gating circuits 802A and 803A, CTRL is driven to logic low and $\overline{CTRL}$ is driven to logic high. The logic low state of CTRL turns on transistor MP1 to connect power node P1 to VDD, thereby pulling power node P1 to approximately VDD. The logic high state of $\overline{CTRL}$ turns on transistor MN1 to connect power node P2 to ground potential, thereby pulling power node P2 to approximately ground potential. In this mode, gating circuits 802(A) and 803(A) provide a full operating voltage (e.g., VDD) to the corresponding memory array 701.

To place a corresponding memory array 701 in the suspend mode using gating circuits 802A and 803A, CTRL is driven to logic high and $\overline{CTRL}$ is driven to logic low. The logic high state of CTRL turns off transistor MP1, and diode-connected transistor MP2 generates a diode voltage drop (VTP) between VDD and power node P1. The logic low state of $\overline{CTRL}$ turns off transistor MN1, and diode-connected transistor MN2 generates a diode voltage drop (VTN) between power node P2 and ground potential. In this mode, gating circuits 802(A) and 803(A) provide a reduced operating voltage of approximately VDD-VTP-VTN to the corresponding memory array 701.

For some embodiments, transistors MP1-MP2 and MN1-MN2 are high-voltage transistors having relatively large channel widths and relatively thick gate oxides to withstand large voltage differentials. Further, the diode drops provided by diode-connected transistors MP2 and MN2 may be adjusted by changing various manufacturing process parameters such as, for example, the dopant concentrations in the transistor channel regions, the gate oxide thickness, and the like.

FIG. 8B shows a high gating circuit 802(B) and a low gating circuit 803(B) in accordance with another embodiment of the present invention. High gating circuit 802(B) includes PMOS transistor MP1 and a multiplexer MUX1. Transistor MP1 is coupled between VDD and power node P1, and includes a gate to receive a control signal C1 from an output of MUX1. MUX1 includes a first input coupled to ground potential, a second input coupled to power node P1, and a control terminal to receive CTRL. Low gating circuit 803(B) includes NMOS transistor MN1 and a multiplexer MUX2. Transistor MN1 is coupled between ground potential and power node P2, and includes a gate to receive a control signal C2 from an output of MUX2. MUX2 includes a first input coupled to VDD, a second input coupled to power node P2, and a control terminal to receive $\overline{CTRL}$.

To place a corresponding memory array 701 in the active mode using gating circuits 802B and 803B, CTRL is driven to a first state (e.g., logic low). The first state of CTRL causes MUX1 to couple its output to ground potential (thus driving C1 to logic low), which turns on transistor MP1 to connect power node P1 to VDD, thereby pulling power node P1 to approximately VDD. The resulting state of $\overline{CTRL}$ (e.g., logic high) causes MUX2 to couple its output to VDD (thus driving C2 to logic high), which turns on transistor MN1 to connect power node P2 to ground potential, thereby pulling power node P2 to approximately ground potential. In this mode, gating circuits 802(B) and 803(B) provide a full operating voltage (e.g., VDD) to the corresponding memory array 701.

To place a corresponding memory array 701 in the suspend mode using gating circuits 802B and 803B, CTRL is driven to a second state (e.g., logic high). The second state of CTRL causes MUX1 to couple its output to power node P1, thereby configuring transistor MP1 as a diode-connected transistor that generates a diode voltage drop (VTP) between VDD and power node P1. The resulting state of $\overline{CTRL}$ (e.g., logic low) causes MUX2 to couple its output to power node P2, thereby configuring transistor MN1 as a diode-connected transistor that generates a diode voltage drop (VTN) between ground potential and power node P2. In this mode, gating circuits 802(B) and 803(B) provide a reduced operating voltage of approximately (VDD-VTP-VTN) to the corresponding memory array 701.

For other embodiments, MUX2 of low gating circuit 803(B) may receive the control signal CTRL provided to MUX1 of high gating circuit 802(B). For such embodiments, the input assignments of MUX2 are reversed such that driving CTRL to the first state causes MUX2 to couple its output to VDD, and driving CTRL to the second state causes MUX2 to couple its output to power node P2. Other similar permutations will be known to those of ordinary skill in the art.

FIG. 8C shows a high gating circuit 802(C) and a low gating circuit 803(C) in accordance with yet another embodiment of the present invention. High gating circuit 802(C) is similar to high gating circuit 802(B) of FIG. 8B, except that MUX1 of high gating circuit 802(C) further includes a third input coupled to VDD. Low gating circuit 803(C) is similar to low gating circuit 803(B) of FIG. 8B, except that MUX2 of low gating circuit 803(C) further includes a third input coupled to ground potential. Gating circuits 802(C) and 803(C) implement the active and suspend modes in the manner described above with respect to FIG. 8B. For example, to place the corresponding memory array 701 in the active mode, CTRL is driven to the first state to cause transistor MP1 to couple power node P1 to VDD, and its complement $\overline{CTRL}$ causes transistor MN1 to couple power node P2 to ground potential. Further, to place the corresponding memory array 701 in the suspend mode, CTRL is driven to the second state to cause transistor MP1 to be configured as a diode that provides a diode drop (VTP) between VDD and power node P1, and its complement $\overline{CTRL}$ causes transistor MN1 to be configured as a diode that provides a diode drop (VTN) between power node P2 and ground potential. Note that control signal CTRL and its complement $\overline{CTRL}$ are used above generically to refer to control signals provided to MUX1 and MUX2, and those of ordinary skill in the art will understand that other control signals may be possible. For example, CTRL may be a multi-bit signal that may have at least three different states. As another example $\overline{CTRL}$ need not be the complement of CTRL, and the order of the inputs to MUX1 and MUX2 may be changed to correspond to various control signals. In one embodiment, the same CTRL signal may be provided to both MUX1 and MUX2, with the order of the inputs chosen to implement the desired power reducing behavior.

To place the corresponding memory array 701 in the inactive mode using gating circuits 802C and 803C, CTRL is driven to a third state that causes MUX1 to couple its output to VDD (thus driving C1 to logic high), and its complement $\overline{CTRL}$ causes MUX2 to couple its output to ground potential (thus driving C2 to logic low). The resulting logic high state of C1 turns off transistor MP1 to isolate power node P1 from VDD, and the resulting logic low state of C2 turns off transistor MN1 to isolate power node P2 from ground potential. In this mode, gating circuits 802(C) and 803(C) provide a negligible operating voltage to the corresponding memory array 701, thereby effectively disabling the corresponding memory array 701 and thus minimizing its power consumption.

For other embodiments, MUX2 of low gating circuit 803(C) may receive the control signal CTRL provided to MUX1 of high gating circuit 802(C). For such embodiments, the input assignments of MUX2 are appropriately modified such that driving CTRL to the first state causes MUX2 to couple its output to VDD, driving CTRL to the second state causes MUX2 to couple its output to power node P2, and driving CTRL to the third state causes MUX2 to couple its output to ground potential.

FIG. 8D shows a high gating circuit 802(D) and a low gating circuit 803(D) in accordance with yet another embodiment of the present invention. High gating circuit 802(D) is similar to high gating circuit 802(C) of FIG. 8C, except that MUX1 of high gating circuit 802(D) further includes a second control terminal to receive a select signal S1 from a memory cell MC1. Low gating circuit 803(D) is similar to low gating circuit 803(C) of FIG. 8C, except that MUX2 of low gating circuit 803(D) further includes a second control terminal to receive a select signal S2 from a memory cell MC2. Memory cells MC1-MC2 may be any suitable type of memory element including, for example, SRAM, DRAM, PROM, EPROM, EEPROM, flash memory cells, fuses, and the like). For other embodiments, the select signals S1-S2 for gating circuit pairs 802(D) and 803(D) may be the same signal, which in turn may be stored in a single memory cell MC.

The select signals S1-S2 may be stored in memory cells MC1-MC2, respectively, in any suitable manner. For some embodiments, select signals S1-S2 may be stored in memory cells MC1-MC2 during configuration of the PLD to disable one or more memory arrays not used by a particular user design, thereby minimizing static power consumption of the unused memory arrays 701. For other embodiments, select signals S1-S2 may be written to memory cells MC1-MC2 during normal operation of the PLD using one or more externally-generated signals (e.g., user-generated signals) and/or in response to observed operating conditions (e.g., indicating that one or more memory arrays 701 have been idle for a predetermined time period and may be placed in the suspend mode to reduce power consumption).

Gating circuits 802(D) and 803(D) implement the active, suspend, and inactive modes in a manner similar to that described above with respect to FIG. 8C, except that the select signals S1-S2 determine whether assertion of CTRL to the second state (e.g., logic high) configures gating circuits 802(D) and 803(D) to implement the suspend mode or the inactive mode. Thus, when CTRL is driven to the first state (e.g., logic low), gating circuits 802(D) and 803(D) implement the active mode, irrespective of the values of select signals S1-S2, in a manner similar to that described above with respect to FIG. 8B. For example, the logic low state of CTRL causes MUX1 to couple its output to ground potential (thus driving C1 to logic low), which turns on transistor MP1 to connect power node P1 to VDD, thereby pulling power node P1 to approximately VDD. The complemented signal $\overline{CTRL}$ causes MUX2 to couple its output to VDD (thus driving C2 to logic high), which turns on transistor MN1 to connect power node P2 to ground potential, thereby pulling power node P2 to approximately ground potential. In this mode, gating circuits 802(D) and 803(D) provide a full operating voltage to the corresponding memory array 701.

When CTRL is driven to the second state (e.g., to logic high), gating circuits 802(D) and 803(D) selectively implement either the suspend mode or the inactive mode, depending upon the values of select signals S1-S2. For example, if S1-S2 are logic low, the logic high state of CTRL causes MUX1 to couple its output to power node P1, thereby configuring transistor MP1 as a diode-connected transistor that generates a diode voltage drop (VTP) between VDD and power node P1. The complemented signal $\overline{CTRL}$ causes MUX2 to couple its output to power node P2, thereby configuring transistor MN1 as a diode-connected transistor that generates a diode voltage drop (VTN) between ground potential and power node P2. In this mode, which may correspond to the suspend mode, gating circuits 802(D) and 803(D) provide a reduced operating voltage of approximately VDD-VTP-VTN to the corresponding memory array 701.

Conversely, if select signals S1-S2 are logic high, the logic high state of CTRL causes MUX1 to couple its output to VDD (i.e., thus driving C1 to logic high), and the complemented signal $\overline{CTRL}$ causes MUX2 to couple its output to ground potential (i.e., thus driving C2 to logic low). The resulting logic high state of C1 turns off transistor MP1 to isolate power node P1 from VDD, and the resulting logic low state of C2 turns off transistor MN1 to isolate power node P2 from ground potential. In this mode, which may correspond to the inactive mode, gating circuits 802(D) and 803(D) provide a negligible operating voltage to the corresponding memory array 701, thereby effectively disabling the corresponding memory array 701 to minimize its power consumption.

The operational modes implemented by CTRL and S1-S2 for the exemplary embodiment of high gating circuit 802(D) are summarized below in the truth table 1.

TABLE 1

| CTRL | S1 | S2 | mode |
|------|----|----|------|
| 0 | x | x | active |
| 1 | 0 | 0 | suspend |
| 1 | 1 | 1 | inactive |

The operational modes implemented by $\overline{CTRL}$ and S1-S2 for the exemplary embodiment of low gating circuit 803(D) are summarized below in the truth table 2.

TABLE 2

| $\overline{CTRL}$ | S1 | S2 | mode |
|------|----|----|------|
| 1 | x | x | active |
| 0 | 0 | 0 | suspend |
| 0 | 1 | 1 | inactive |

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

What is claimed is:

1. An integrated circuit (IC) device, comprising:
   a power rail to provide a supply voltage;
   a plurality of logic blocks, each having a first power terminal and a second power terminal; and
   a first gating circuit coupled between the power rail and the first power terminals of the logic blocks and having a control terminal to receive a first control signal,
   wherein the first gating circuit is configured to selectively provide a diode voltage drop between the power rail and the first power terminals of the logic blocks in response to the first control signal; and
   wherein the first gating circuit comprises:
   a transistor coupled between the power rail and the first power terminals and having a gate; and
   a multiplexer having a first input coupled to ground potential, a second input coupled to the first power terminals, an output coupled to the gate of the transistor, and a control terminal to receive the first control signal.

2. The IC device of claim 1, further comprising a memory array, wherein the memory array includes the one or more of the logic blocks.

3. The IC device of claim 1, wherein the first gating circuit comprises a plurality of first gating circuits, each coupled between the power rail and the first power terminal of a corresponding one of the logic blocks and each responsive to a unique first control signal.

4. The IC device of claim 1, wherein the first gating circuit comprises:
   a transistor coupled between the power rail and the first power terminals and having a gate to receive the first control signal; and
   a first diode coupled between the first power rail and the first power terminals.

5. The IC device of claim 4, wherein during an active mode the control signal is in a first state that enables the transistor to provide the supply voltage to the first power terminals, and
   wherein during a suspend mode the control signal is in a second state that disables the transistor to provide a reduced supply voltage to the first power terminals via the first diode.

6. The IC device of claim 1, wherein the multiplexer further comprises a third input coupled to the power rail.

7. The IC device of claim 6, wherein during an active mode the transistor is enabled to provide the supply voltage to the first power terminals,
 wherein during a suspend mode the transistor is configured as a diode to provide a reduced supply voltage to the first power terminals, and
 wherein during an inactive mode the transistor is disabled to provide a negligible voltage to the first power terminals.

8. The IC device of claim 7, further comprising:
a memory cell coupled to a second control terminal of the multiplexer, the memory cell for storing a select signal that selects between the suspend mode and the inactive mode.

9. The IC device of claim 1, further comprising:
a second gating circuit coupled between ground potential and the second power terminals of the logic blocks and having a control terminal to receive a second control signal, wherein the second gating circuit is configured to selectively provide a voltage drop between the second power terminals of the logic blocks and ground potential.

10. The IC device of claim 9, wherein the second gating circuit comprises a plurality of second gating circuits, each coupled between ground potential and the second power terminal of a corresponding one of the logic blocks and each responsive to a unique second control signal.

11. An integrated circuit (IC) device, comprising:
a power rail to provide a supply voltage;
a logic block having a first power terminal and a second power terminal;
a first transistor coupled between the power rail and the first power terminal of the logic block and having a gate to receive a first control signal;
a first diode connected between the power rail and the first power terminal of the logic block; and
a multiplexer having a first input coupled to around potential, a second input coupled to the first power terminal, an output coupled to the gate of the transistor, and a control terminal to receive the first control signal.

12. The IC device of claim 11, wherein during an active mode the first control signal is in a first state that enables the first transistor to provide the supply voltage to the first power terminal, and
 wherein during a suspend mode the first control signal is in a second state that disables the first transistor to provide a reduced operating voltage to the first power terminal, the reduced operating voltage equal to the supply voltage minus a voltage drop across the first diode.

13. The IC device of claim 11, further comprising:
a second transistor coupled between ground potential and the second power terminal of the logic block and having a gate to receive a second control signal; and
a second diode connected between ground potential and the second power terminal of the logic block.

14. An integrated circuit (IC) device, comprising:
a power rail to provide a supply voltage;
a logic block having a first power terminal and a second power terminal;
a first transistor coupled between the power rail and the first power terminal of the logic block and having a gate; and
a first multiplexer having an output coupled to the gate of the first transistor, a first input coupled to ground potential, a second input coupled to the first power terminal of the logic block, and a control terminal to receive a first control signal.

15. The IC device of claim 14, wherein the first multiplexer further comprises a third input coupled to the power rail.

16. The IC device of claim 15, wherein during an active mode the first control signal is driven to a first state that causes the first transistor to provide the supply voltage to the first power terminal,
 wherein during a suspend mode the first control signal is driven to a second state that causes the first transistor to provide a reduced operating voltage to the first power terminal, and
 wherein during an inactive mode the first control signal is driven to a third state that causes the first transistor to provide a negligible voltage to the first power terminal.

17. The IC device of claim 16, further comprising:
a memory cell coupled to a second control terminal of the first multiplexer, the memory cell for storing a select signal that selects between the suspend mode and the inactive mode.

18. The IC device of claim 14, further comprising:
a second transistor coupled between ground potential and the second power terminal of the logic block and having a gate; and
a second multiplexer having an output coupled to the gate of the second transistor, a first input coupled to the power rail, a second input coupled to the second power terminal of the logic block, and a control terminal to receive a second control signal.

19. The IC device of claim 18, wherein the second multiplexer further comprises a third input coupled to ground potential.

* * * * *